US008405045B2

(12) United States Patent
Preikszas et al.

(10) Patent No.: US 8,405,045 B2
(45) Date of Patent: Mar. 26, 2013

(54) PARTICLE BEAM DEVICE WITH DEFLECTION SYSTEM

(75) Inventors: Dirk Preikszas, Oberkochen (DE); Armin Heinz Hayn, Essex (GB)

(73) Assignees: Carl Zeiss NTS GmbH, Oberkochen (DE); Carl Zeiss NTS Ltd., Oberkochen (DE)

( * ) Notice: Subject to any disclaimer, the term of this patent is extended or adjusted under 35 U.S.C. 154(b) by 0 days.

(21) Appl. No.: 13/306,529

(22) Filed: Nov. 29, 2011

(65) Prior Publication Data

US 2012/0138814 A1 Jun. 7, 2012

(30) Foreign Application Priority Data

Dec. 3, 2010 (DE) .................... 10 2010 053 194

(51) Int. Cl.
*H01J 3/26* (2006.01)
*H01J 3/14* (2006.01)

(52) U.S. Cl. ............. 250/396 R; 250/396 ML; 250/397; 250/492.23

(58) Field of Classification Search ............. 250/396 R, 250/396 ML, 397, 492.23
See application file for complete search history.

(56) References Cited

U.S. PATENT DOCUMENTS

| 4,701,623 A * | 10/1987 | Beasley ..................... 250/492.2 |
| 6,123,123 A | 9/2000 | Carder, Sr. et al. |
| 6,376,842 B1 * | 4/2002 | Yamada ..................... 250/398 |
| 6,576,908 B1 * | 6/2003 | Winkler et al. ........... 250/396 R |
| 6,809,322 B2 | 10/2004 | Danilatos |

FOREIGN PATENT DOCUMENTS

| DE | 135311 B3 | 4/1979 |
| FR | 2415348 | 8/1979 |

OTHER PUBLICATIONS

E. Munro, "Design and optimization of magnetic lenses," J. Vac. Sci. Technol., 12, 1975, 1146-1150.
B. Lencová, "On the design of electron beam deflection systems," Optik 79, 1988, 1-12.
Y. Uno et al.: Fifth-order aberration analysis of a combined electrostatic-magnetic focusing-deflection system, Nuclear Instruments and Methods in Physics Research A, 363, 1995, 10-17.
German Examination Report for corresponding DE Application No. 10 2010 053 194.4, dated Jun. 22, 2011.

* cited by examiner

*Primary Examiner* — Nikita Wells
(74) *Attorney, Agent, or Firm* — Fish & Richardson P.C.

(57) ABSTRACT

A particle beam device includes a particle beam generator, an objective lens, and first and second deflection systems for deflecting the particle beam in an object plane defined by the objective lens. In a first operating mode, the first deflection system generates a first deflection field and the second deflection system generates a second deflection field. In a second operating mode, the first deflection system generates a third deflection field and the second deflection system generates a fourth deflection field.

20 Claims, 9 Drawing Sheets

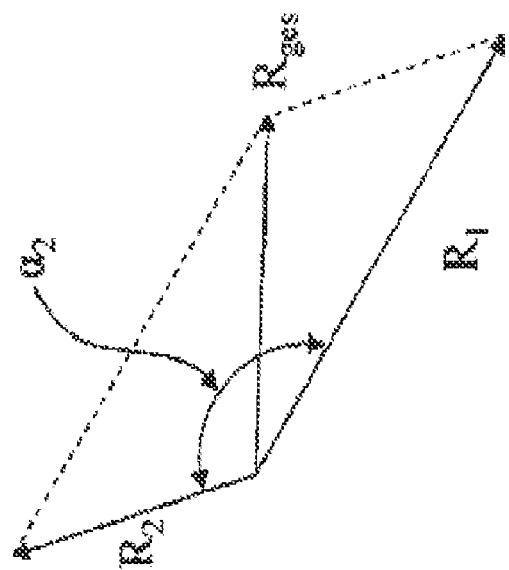
FIG.2b
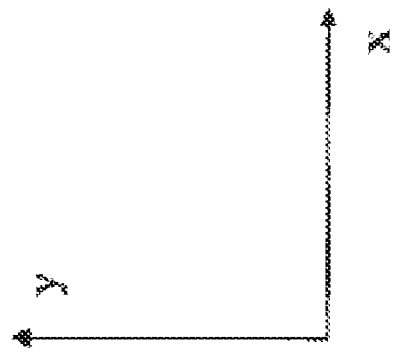
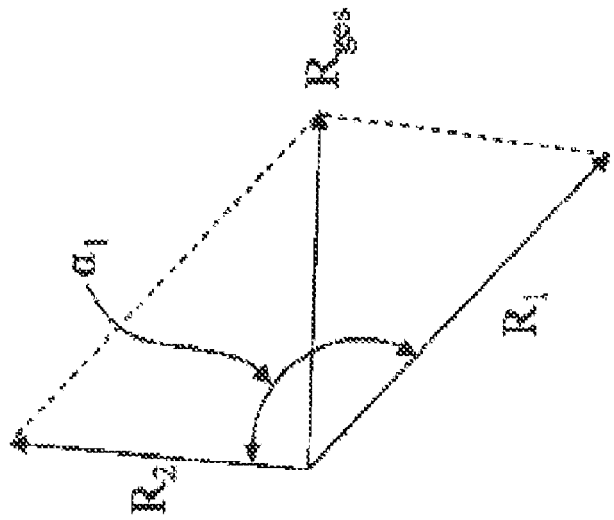
FIG.2a r-trajectories to the corresponding images

PARTICLE BEAM DEVICE WITH DEFLECTION SYSTEM

CROSS-REFERENCE TO RELATED APPLICATIONS

This application claims benefit under 35 USC 119 of German Application No. 10 2010 053 194.4, filed Dec. 3, 2010, the entire disclosure of which is incorporated by reference herein.

FIELD

The present disclosure relates to a particle beam device including a first and a second deflection system for deflecting the particle beam in an object plane. The present disclosure relates, in particular, to a particle beam device in the form of an electron microscope, for example a scanning electron microscope or a transmission electron microscope, an ion microscope or an electron beam or ion beam lithography system. The present disclosure additionally relates to a method for operating a corresponding particle beam device.

BACKGROUND

Particle beam devices of the type mentioned above often have deflection systems which can be used to deflect the particle beam in the object plane substantially perpendicularly to the direction of propagation of the particle beam. By detecting the interaction products of the particle beam with a sample surface arranged in the object plane in a manner dependent on the deflection of the particle beam, it is then possible to generate an image of the sample surface. As an alternative or in addition thereto, a process gas which can be activated by the particle beam can be fed to the sample surface, with the aid of which gas, then in the regions in which the particle beam impinges on the sample surface, the sample surface is locally etched or material from the process gas is deposited on the sample surface.

Furthermore, it is possible for a particle-sensitive layer previously applied to the sample surface to be locally exposed with the aid of the particle beam and then to be patterned by further methods.

The particle beam is generated in a particle beam generator and focused by an objective lens in the object plane. The particle beam focused there is often and also hereinafter also designated as a particle probe.

The movement of the particle probe is generally effected by a deflection of the particle beam by a magnetic field generated with the aid of coils, and/or with the aid of an electric field generated with the aid of electrodes. The coils of magnetic deflection systems are often embodied as air-core coils which can be arranged outside the vacuum tube and which enable the particle beam or the particle probe to be deflected sufficiently rapidly.

For focusing the particle beam or for generating the particle probe, it is possible to use an objective lens which is likewise formed by magnetic and/or electric fields. The objective lens is usually operated with a focal length that is as short as possible, in order to achieve a resolution that is as good as possible. On account of the small focal length of the objective lens, the working distance between the objective lens and the object plane is very small and generally amounts to only a few millimeters to a few centimeters. On account of the small structural space between the objective lens and the object plane, the deflection systems are generally arranged on the source side of the objective lens.

If, for the deflection of the particle beam, a single simple deflection system is used on the source side or within the objective lens, the particle beam runs through the objective lens with different degrees of obliqueness depending on the intensity of the deflection of the particle beam, as a result of which image aberrations dependent on the deflection of the particle beam arise. In order that such image aberrations dependent on the deflection angle are avoided or kept small, so-called double deflection systems are often used, which have two individual deflection systems arranged at a distance from one another in the direction of the optical axis of the particle beam or the objective lens. Through suitable combination of the deflections of two deflection systems arranged serially one behind the other, it is possible to shift the position of a virtual tilting point along the particle-optical axis, wherein the deflection appears virtually as if produced by tilting about the tilting point. As a result, it is possible, for example, to produce a virtual tilting point for the deflection in a plane which leads to a minimization of the additional image aberrations dependent on the intensity of the deflection, even if the corresponding plane is inaccessible for the arrangement of a deflection system.

The adjustment of the deflection fields of the two deflection systems arranged serially one behind the other along the optical axis and of the currents and/or voltages used for generating the deflection fields is usually effected in the course of adjusting the particle beam device in a manner dependent on the objective lens specifically used. In this case, the adjustment is generally effected in such a way that the additional image aberrations generated by the deflection, which are then dependent on the intensity of the deflection, are minimal The adjustment data correspondingly obtained in the course of adjusting the particle beam device are then stored and no longer changed during the subsequent operation of the particle beam device.

U.S. Pat. No. 6,809,322 discloses a particle beam device having three deflection systems arranged serially one behind another. What is intended to be achieved via the three deflection systems arranged serially one behind another is that the image field maximally scanned with the particle beam in the object plane is not trimmed, or is trimmed only as little as possible, by a pressure stage aperture arranged between the objective lens and the object plane.

In some particle beam devices from the applicant it is possible to operate them in a so-called "fish-eye mode". In this "fish-eye mode", two deflection systems arranged serially one behind the other produce deflections in the same direction. The particle beam then runs off-axis to a very great extent in the case of a deflection in the objective lens, which leads to severe off-axis aberrations. The image recorded in this "fish-eye mode" therefore has very severe aberrations dependent on the deflection angle, but at the same time makes it possible to generate a very large overview image of the entire sample, or of the entire interior of the sample chamber. This "fish-eye mode" is achieved by virtue of the fact that, upon changeover to this "fish-eye mode", the polarity of the deflection system arranged nearer to the objective lens is changed over relative to the normal operation mode.

In some other particle beam devices from the applicant, it is possible to operate them in a so-called "tilting raster mode". In this "tilting raster mode", two deflection systems arranged serially one behind the other produce deflections in the same direction, but in a somewhat different ratio. The particle beam then still runs off-axis in the case of a deflection in the objective lens, and is then directed by the objective lens again to that point on the sample on which the particle beam impinges even without deflection. The deflection in the two deflection systems is therefore effected in the manner as if the deflected particle beam came from the particle source. It is thus possible to realize measurements concerning the crystal microstructure of the sample, since other interaction products arise depending on the orientation of the impinging particle beam. This "tilting raster mode" is achieved by virtue of the fact that, upon changeover to this "tilting raster mode", a suitable resistor-inductor combination is connected in parallel with the deflection system arranged nearer to the objective lens, relative to the normal operation mode.

SUMMARY

The present disclosure provides a particle beam device which makes it possible to optimize the beam deflection for different applications or operating conditions.

A particle beam device according to the disclosure has a particle beam generator. The particle beam generator can have, for example, an electron source such as a thermal tungsten emitter, an $LAB_6$ emitter or a Schottky emitter or an ion emitter, such as a gas field ionization source. The particle beam device can furthermore have an objective lens for focusing the particle beam generated by the particle beam generator in an object plane. In this case, the objective lens defines an optical axis about which the objective lens—apart from manufacturing tolerances—is formed rotationally symmetrically.

The particle beam device can have a first deflection system and a second deflection system for deflecting the particle beam in the object plane, wherein the first and the second deflection system are arranged serially one behind the other along the optical axis with a distance between the first and second deflection systems. In a first operating mode, the first deflection system can generate a first deflection field and the second deflection system can generate a second deflection field. The first and the second deflection field have a first angular orientation with respect to one another and can be aligned with respect to one another such that they jointly bring about in the object plane a deflection of the particle beam in a first direction. In a second operating mode of the particle beam device, the first deflection system generates a third deflection field and the second deflection system generates a fourth deflection field, wherein the third and the fourth deflection field have a second angular orientation with respect to one another, which is different than the first angular orientation between the first deflection field and the second deflection field in the first operating mode. In the second operating mode, too, the third and the fourth deflection field bring about together in the object plane a deflection of the particle beam in the same direction in which the particle beam is deflected in the first operating mode.

The disclosure is based on the insight that it is useful if, for different operating conditions of the particle beam device, different angular orientations of the deflection fields of the first and of the second deflection system with respect to one another can be set. As a result, depending on the application condition, it is possible to set the angular orientation of the deflection fields with respect to one another such that the aberrations having the greatest disturbance during the respective application can be avoided or compensated for.

In order to achieve different angular orientations of the deflection fields with respect to one another in the first operating mode and in the second operating mode, the third deflection field should deviate from the first deflection field and/or the fourth deflection field, in particular in terms of the angular orientation, should deviate from the second deflection field.

In a first operating mode, the first angular orientation can be chosen such that the off-axis coma aberration during the focusing of the particle beam by the objective lens is minimal Alternatively, in the first operating mode, the angular orientation of the first and of the second deflection field with respect to one another can be chosen such that the common blurring effect of off-axis coma aberration and off-axis dispersion during the focusing of the particle beam by the objective lens is minimal. A minimization of the off-axis coma aberration or a minimization of the common blurring effect of off-axis coma aberration and off-axis dispersion is advantageous particularly in an operating mode in which images are intended to be recorded with very high spatial resolution (achievable by the correction of the axial image aberrations), or with a high number of pixels or structures are intended to be written with very high spatial resolution or a large number of pixels.

In a second operating mode, the second angular orientation can be chosen such that the distortion during the focusing of the particle beam by the objective lens is minimal. An angular orientation with minimal distortion is advantageous when images are intended to be recorded with a maximum image field or structures are intended to be written with a maximum size. If, in such a particle beam system, the intention is to change between an operating mode which enables a maximum image field and an operating mode which enables a maximum number of pixels, the angular orientation of the deflection fields of the first and of the second deflection system with respect to one another is also changed.

Alternatively or supplementarily, in one operating mode, the first angular orientation can be chosen such that the trimming of the image field by a bottleneck in the beam tube during the focusing of the particle beam by the objective lens becomes minimal Such an operating mode is useful particularly when the particle beam device can also be operated in a so-called "variable pressure" range in which a relatively high gas pressure prevails in the sample chamber. The operation of the particle beam device in the "variable pressure" mode generally involves a pressure stage aperture between the objective lens and the object plane, in order that a good vacuum can be maintained in the beam tube despite the relatively high pressure in the sample chamber. Since the pressure stage aperture has only a small opening, a trimming of the image field often occurs in the "variable pressure" operation mode. What can be achieved by suitably choosing the angular orientation of the deflection fields with respect to one another is that the particle beam, independently of the deflection angle, passes through the opening of the pressure stage aperture relatively near to the particle-optical axis, such that no or only slight trimming of the image field occurs.

Different angular orientations of the deflection fields can be realized by the first deflection system and the second deflection system being embodied as crossed deflection systems, which therefore enable beam deflection in two directions that are not parallel to one another, and that are preferably perpendicular to one another. The driving for the deflection fields in one crossed deflection system or in both crossed deflection systems can be mixed differently depending on the operating mode set.

Alternatively or supplementarily, it is possible to arrange three beam deflection systems serially one behind another in the beam path, wherein at least one of the three beam deflection systems is arranged in a manner rotated about the optical axis relative to the other two beam deflection systems. Furthermore, it is also possible, of course, for all three deflection systems to be arranged in a manner rotated with respect to one another about the optical axis relative to one another. In this case, the angle of rotation between the orientations of the deflection systems should be at least 5 degrees, preferably more than 10 degrees, and in turn preferably more than 20 degrees, in order that the different total angular orientations involved for an optimization of the course of the particle beam paths through the objective are possible.

The change in the angular orientation of the deflection fields with respect to one another can be effected, in the case of a particle beam system including three deflection systems arranged serially one behind another, by virtue of that fact that, depending on the operating mode, one of the deflection systems is switched on or one of the deflection systems is switched off. Polarity reversal of a deflection system or interconnection with passive electrical components (resistor, coil, capacitor) is also possible for this purpose.

The change in the angular orientation between the deflection fields can be effected manually or else automatically. By way of example, it is possible for the angular orientation to be changed automatically if a change is made between operating modes with different maximum deflections in the object plane, which corresponds to a change in the magnification in the case of a scanning electron microscope. Alternatively, it is possible to vary the angular orientation of the deflection fields with respect to one another if the illumination aperture of the particle beam is changed. By way of example, it is possible, in the case of an illumination with a high aperture, to set an angular orientation of the deflection fields in the case of which the objective lens has a low spherical aberration independently of the deflection angle. What can thereby be achieved is that images are recorded with a maximum spatial resolution or structures are written with a maximum resolution, that is to say that a particle probe having a smallest possible diameter is achieved. Under certain circumstances, in the case of this angular orientation, a certain increase in distortion at the edges of the image field will be permitted in order to avoid an excessively great negative effect of the spherical aberration. By contrast, if the particle beam device is operated in an operating mode in which the particle beam has only a small illumination aperture and, accordingly, the spherical aberration of the objective lens has no or only a small influence on the size of the particle probe, a changeover is made to an angular orientation in which the distortion is minimal even in the case of maximum deflection angles.

BRIEF DESCRIPTION OF THE DRAWINGS

Details of the disclosure are described more thoroughly below on the basis of the exemplary embodiments illustrated in the figures, in which specifically:

FIGS. 2a and 2b show diagrams of the deflection fields in two different operating modes;

DETAILED DESCRIPTION

Figure 1:
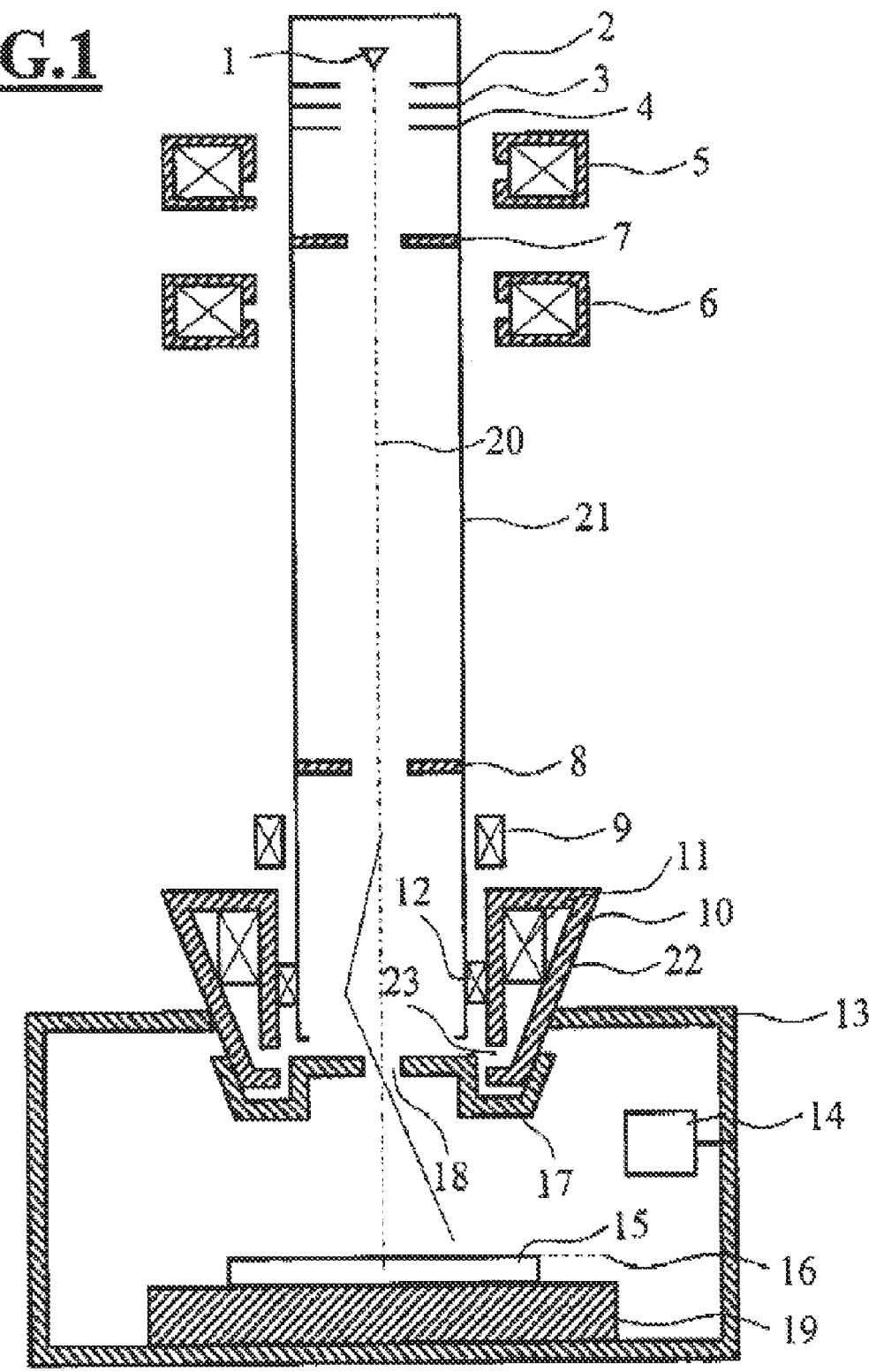
FIG. 1 shows the basic schematic diagram of a particle beam device in the form of a scanning electron microscope in section.

The particle beam device in FIG. 1 has a beam generator including an electron source (1), an extraction electrode (2), a control electrode (3) and an anode (4). In this case, the anode (4) simultaneously forms the source-side end of the beam guiding tube (21). The electron source can be embodied as a thermal field emitter. However, the electron source can likewise be embodied as a thermal tungsten emitter or $LAB_6$ emitter.

Electrons which emerge from the cathode (1) form a primary electron beam. The electrons are accelerated to anode potential on account of a potential difference between the electron emitter (1) and the anode (4). The anode potential is usually 1-30 kV positive relative to the cathode potential, such that the electrons have a kinetic energy in the range of between 1 keV and 30 keV.

At the beam guiding tube (21), two condenser lenses (5), (6) arranged serially one behind the other follow in the direction of propagation of the electrons emerging from the particle beam generator. Between the condenser lenses (5), (6), an aperture stop (7) is arranged in the beam guiding tube. Through different combinations of the excitations of the condenser lenses (5) and (6), it is possible to vary the aperture of the electron beam emerging from the sample-side condenser lens (6).

In the further course of the particle beam from the particle beam generator to the object plane (16), there follow a source-side deflection system (9), a sample-side deflection system (12) and an objective lens (10). In the exemplary embodiment illustrated here, the objective lens (10) is embodied as a magnetic lens and has a pole shoe (22) with a pole shoe gap (23). A ring coil (11) for generating the magnetic field of the objective lens is arranged in the pole shoe (22). The principal plane of the objective lens (10) lies approximately at the level of the pole shoe gap (23), such that—although the sample-side deflection system (12) is arranged physically in the vicinity of the pole shoe gap (23) of the objective lens (10)—this deflection system (12) in the same way as the source-side deflection system (9) is arranged on the source side upstream of the principal plane of the objective lens (10).

The two beam deflection systems (9), (12) are crossed beam deflection systems, that is to say that each of the two beam deflection systems (9) and (12) can deflect the particle beam in two directions that are not parallel to one another, and that are perpendicular to the direction of the optical axis (20). In the case illustrated in FIG. 1, both beam deflection systems are embodied as magnetic beam deflection systems and accordingly have in each case four air-core coils arranged around the optical axis of the particle beam device. However, it is also conceivable for the beam deflection systems or at least one of the two beam deflection systems to be embodied as an electrostatic beam deflection system. In this case, the relevant beam deflection system embodied electrostatically would have four electrodes to which different electrostatic potentials can be applied.

The objective lens (10) projects from above through an opening into the interior of a sample chamber (13). In the sample chamber (13), a sample (15) can be accommodated on an object stage (19).

The particle beam generated by the beam generator (1) and shaped with the aid of the condenser lenses (5), (6) is focused in an object plane (16) by the objective lens (10). Accordingly, a fine electron probe arises in the object plane (16). The distance between the object plane (16) and the lower edge of the objective lens (10) or the lower edge of the pole shoe (22) of the objective lens (10) is not fixed in this case, but rather can be varied by variation of the excitation of the objective lens along the optical axis (20). By different excitations of the two deflection systems (9), (12), it is possible to deflect the particle beam in the object plane (16) perpendicularly to the optical axis (20), such that that surface of the sample (15) which is positioned in the object plane (16) can be scanned by different deflections of the particle beam.

A detector (14) can be arranged in the sample chamber (13), which detector can be used to detect interaction products of the particle beam with the sample (15) or the surface of the sample (15). As an alternative or supplementarily thereto, a further detector (8) can be arranged in the beam guiding tube, with the aid of which it is possible to detect interaction products of the particle beam with the sample (15) or the surface of the sample (15) which pass into the beam guiding tube (21). By recording the signals detected by one or both of the detectors (8), (14) in a manner dependent on the position in which the particle beam impinges on the surface of the sample (15), it is possible to generate an image of the surface of the sample (15). In addition, it is possible, via a gas inlet system (not illustrated here), to admit a specific precursor gas or process gas into the sample chamber (13), which can be chemically activated by the particle beam at the location at which the particle beam impinges on the surface of the sample (15). Local electron-beam-induced etching of the sample (15) or local electron-beam-induced deposition of material on the surface of the sample (15) is then possible with the aid of such a precursor gas.

FIG. 1 furthermore illustrates a pressure stage aperture holder (17), which can be accommodated on the pole shoe (22) of the objective lens, the pole shoe projecting into the sample chamber (13). The pressure stage aperture holder (17) has an aperture having a small aperture opening (18). Further pressure stage apertures are arranged within the beam guiding tube (21) and not illustrated in FIG. 1. FIG. 1 likewise does not illustrate the vacuum pumps used for generating and maintaining the vacuum used for the operation of the particle beam device within the beam guiding tube (21) and the sample chamber (13).

If the particle beam device is operated with high vacuum in the sample chamber (13), the pressure stage aperture (17) is not necessarily and can accordingly be demounted from the pole shoe (22) of the objective lens (10). As is evident with reference to FIG. 1, in this operating mode it is possible to scan a large image field in the object plane (16), without the particle beam being mechanically trimmed.

If, by contrast, the particle beam device is intended to be operated with relatively high pressure in the sample chamber (pressures in the range of approximately 1 to 3000 Pa), the pressure stage aperture holder (17) has to be mounted on the pole shoe (22) of the objective lens in order that a sufficiently good vacuum can be maintained within the beam guiding tube (21) via differential pumping despite the higher pressure in the sample chamber (13). With the pressure stage aperture holder (17) mounted, the edge of the opening (18) within the pressure stage aperture (17) leads to a trimming of the image field which can be scanned in the object plane (16).

Figure 3:
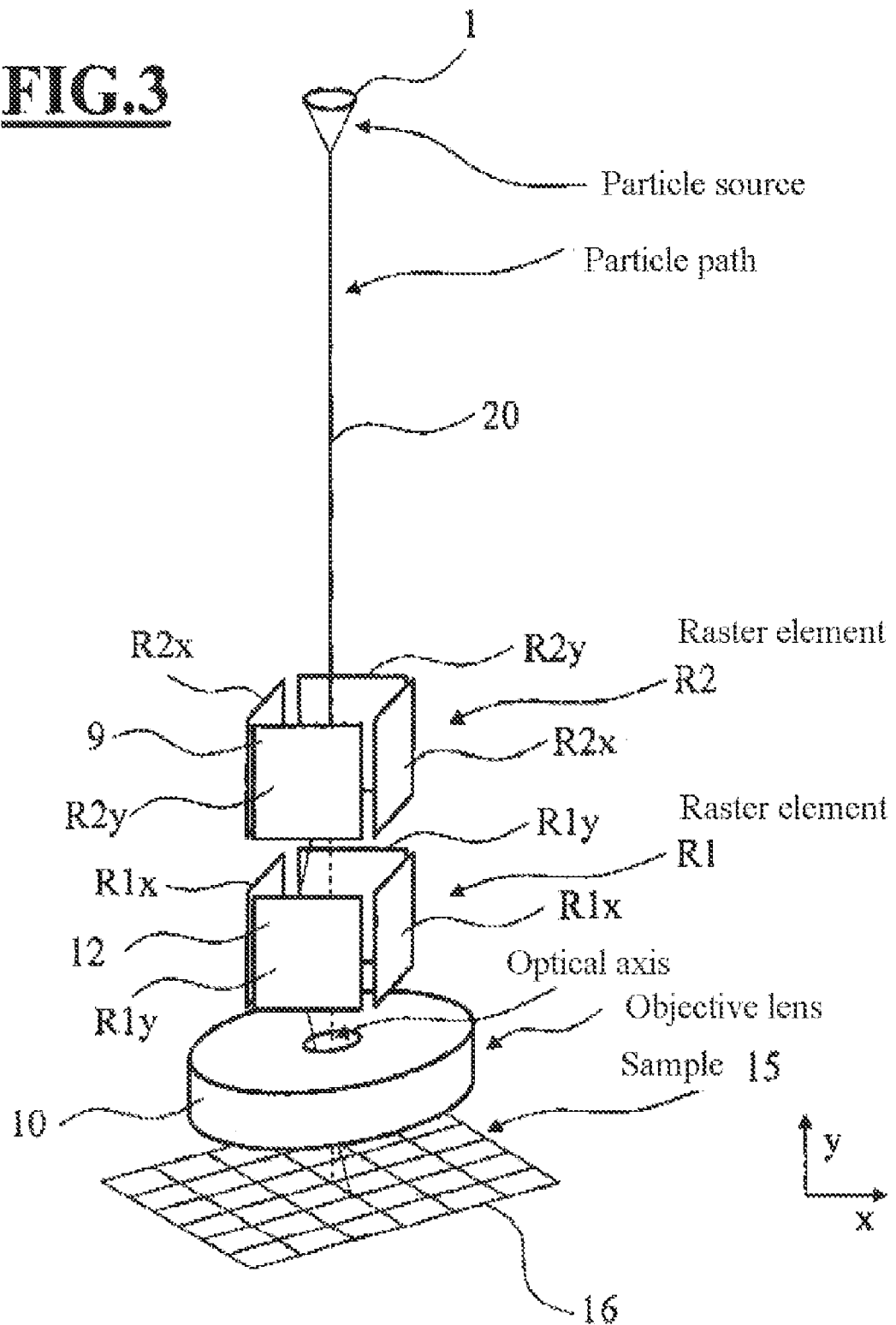
FIG. 3 shows a simplified perspective illustration of a particle beam system.

FIG. 3 illustrates the particle beam system from FIG. 1 once again in a simplified fashion and in perspective view. In this case, the components illustrated in FIG. 3 are provided with the same reference signs as in FIG. 1. As can be gathered from FIG. 3, each of the two deflection systems (9, 12) has in each case four deflection elements distributed around the optical axis. Thus, the sample-side deflection system (12) has two deflection elements $R_{1X}$ which are opposite each other with respect to the optical axis (20) and which bring about a deflection in a first spatial direction (X-direction). In addition, the sample-side deflection system (12) has two deflection elements $R_{1Y}$ which are opposite each other with respect to the optical axis (20) and upon excitation of which the particle beam is deflected in the direction of a second spatial direction (Y-direction), which is ideally perpendicular to the first spatial direction (X-direction), but in any case is not parallel or antiparallel to the first spatial direction. Correspondingly, the source-side deflection system (9) also has four deflection elements $R_{2X}$, $R_{2Y}$, of which in turn two are parallel to each other and the other two are arranged in a manner offset by approximately 90 degrees about the optical axis (20). In the case of the second deflection system (9), too, excitation of the deflection elements $R_{2X}$ brings about a deflection of the particle beam in the first direction (X-direction) and excitation of the pair of deflection elements $R_{2Y}$ substantially perpendicular thereto brings about a deflection of the particle beam substantially perpendicular to the first direction.

Figure 4:
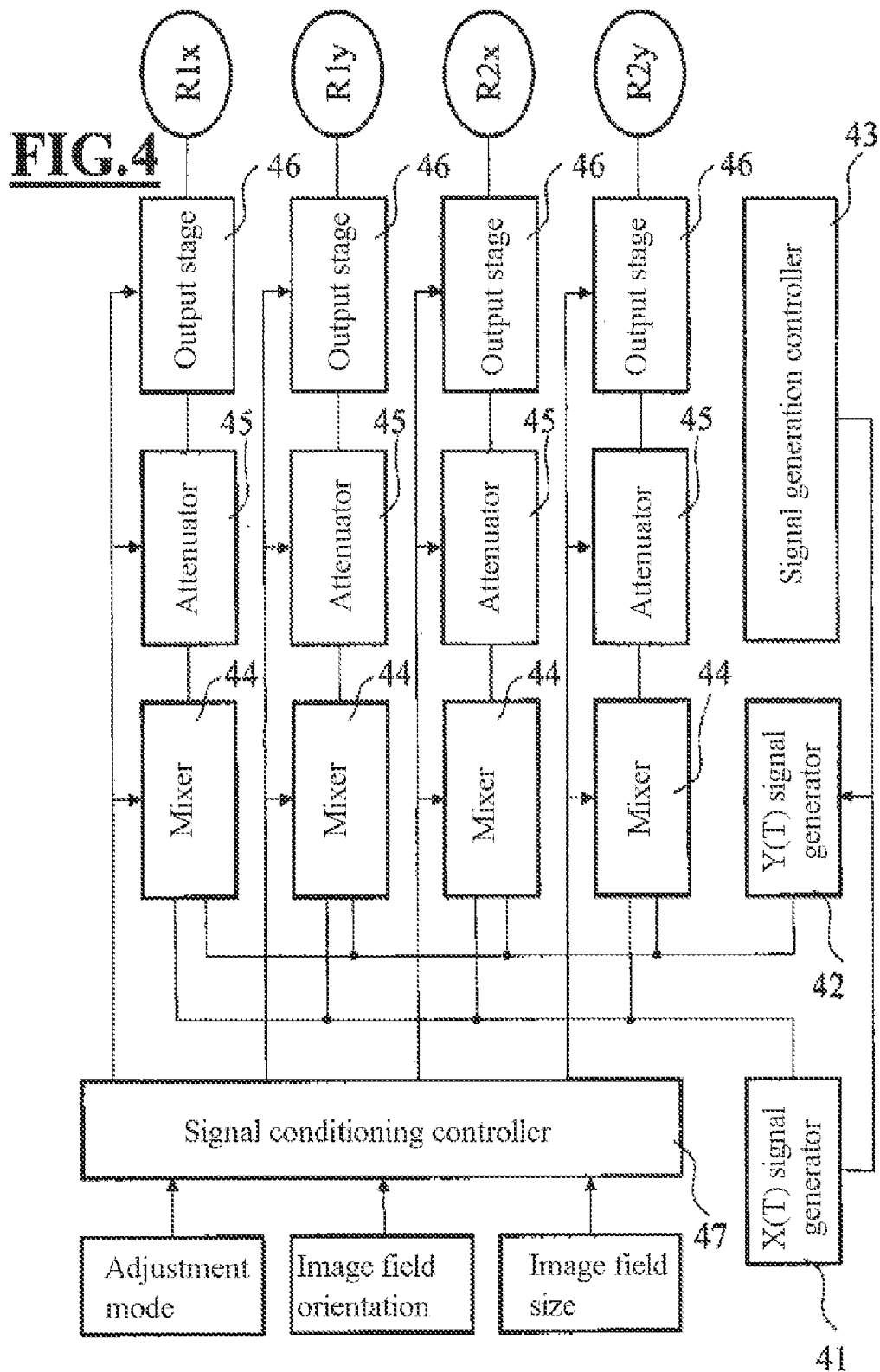
FIG. 4 shows a block diagram for elucidating the driving of the beam deflection systems in the particle beam device in accordance with FIG. 3 in the case of analog signal mixing.
Figure 5:
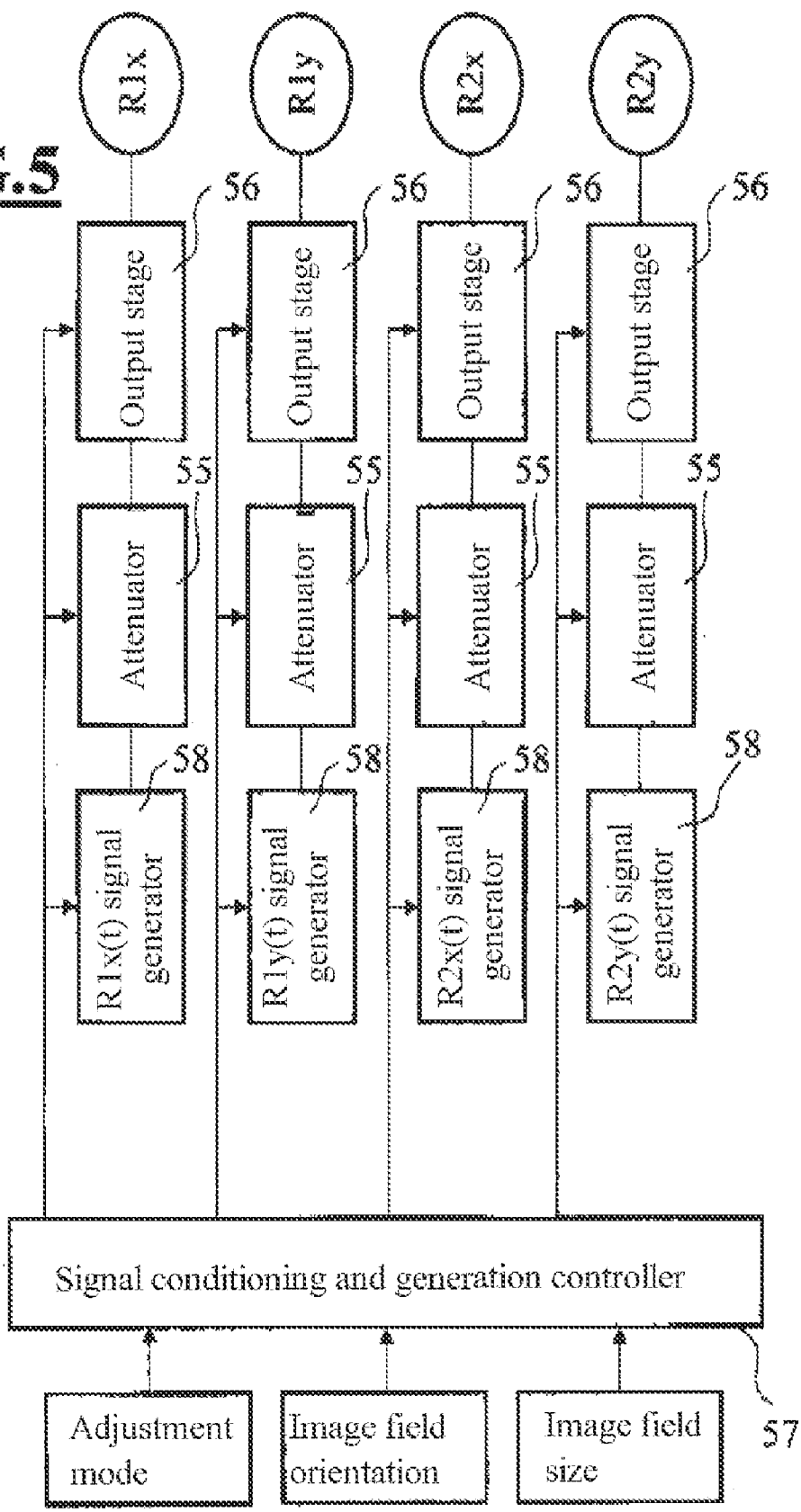
FIG. 5 shows a block diagram for the signal generation of the deflection systems in the case of the particle beam system in accordance with FIG. 3 in the case of digital signal mixing.

For the driving of the deflection systems (9) and (12) it is possible to provide a circuit such as is illustrated in FIGS. 4 and 5. The control circuit has, for each deflection element $R_{1X}$, $R_{1Y}$, $R_{2X}$, $R_{2Y}$ of the two deflection systems (9, 12), a series circuit composed of a mixer (44), an attenuator (45), which influences the magnitude of the output signal of an output stage (46) and hence the image field size, and an output stage (46). The circuit correspondingly consists of four parallel circuits composed of mixer (44), attenuator (45) and output stage (46). Each of the four mixers (44) is fed, as input, the output signal of an X(t) signal generator (41) and of a Y(t) signal generator (42). The output signals generated by the two signal generators (41), (42) in turn are determined by a signal generating controller (43). Depending on which signals are provided by a signal conditioning controller (47), different linear combinations of the signals provided by the two signal generators (41), (42) are generated by the mixers (44) and are output after attenuation by an attenuator (45) and subsequent amplification by an output stage (46) to the respectively assigned deflection element $R_{1X}$, $R_{1Y}$, $R_{2X}$, $R_{2Y}$. In this case, input parameters for the signal conditioning controller (47) are the adjustment mode, the image field orientation and the image field size. Depending on the operating mode currently predefined by the input parameters, the adjustment mode, the image field orientation and the image field size, the mixers (44) generate signals which after attenuation and final amplification with the aid of the deflection elements $R_{1X}$, $R_{1Y}$, $R_{2X}$, $R_{2Y}$ generate deflection fields having different angular orientations with respect to one another.

In a first operating mode, which is illustrated in FIG. 2a, the deflection field generated by the sample-side deflection system (12) is designated by ($R_1$) and the deflection field generated by the source-side deflection system (9) is designated by ($R_2$). The two deflection fields ($R_1$, $R_2$) have different angular orientations, that is to say that they form an angle $\alpha_1$. In total, the two serially successive deflection fields ($R_1$) and ($R_2$)

together with the effect of the objective (10) bring about a deflection of the particle beam in the object plane (16) in the direction of a first direction ($R_{Tot}$). In this case, the direction ($R_{Tot}$) corresponds to the X-direction of the coordinate system illustrated between FIGS. 2a and 2b, that is to say that overall a beam deflection of the particle beam in the X-direction is effected by the two deflection fields ($R_1$) and ($R_2$).

In a second operating mode, which is illustrated in FIG. 2b, once again the deflection field generated by the sample-side deflection system (12) is designated by ($R_1$) and the deflection field generated by the source-side deflection system (9) is designated by ($R_2$). By comparison with the corresponding field directions of the deflection fields in the operating mode in FIG. 2a, the deflection fields have an angular orientation that is changed by comparison with the first operating mode, that is to say that the angle $\alpha_2$ between the two field directions ($R_1$) and ($R_2$) deviates from the angle $\alpha_1$ in the first operating mode. Nevertheless, the serially successive deflection by the deflection fields ($R_1$) and ($R_2$) of the particle beam together with the effect of the objective lens (10) brings about the effect that the particle beam is deflected in the object plane (16) once again in the same deflection direction ($R_{Tot}$) as in the first operating mode illustrated in FIG. 2a. That means that in the operating mode illustrated in FIG. 2b, too, the particle beam is deflected in the object plane (16) in the X-direction in the coordinate system illustrated between FIGS. 2a and 2b.

The details described above can be described mathematically as follows:

Time-dependent signals for the deflection X=X(t) and Y=Y(t) are generated in the signal generators (41, 42). On account of the linear combinations generated from the output signals of the signal generators (41, 42) in the mixers (44) and the subsequent attenuation and subsequent amplification in the output stages (46), the following equation relationship holds true for the deflection fields $R_{1X}$, $R_{1Y}$, $R_{2X}$, $R_{2Y}$:

$$R_{1x}=C_1 \cdot X(t)+C_2 \cdot Y(t) \quad (1)$$

$$R_{1y}=C_3 \cdot X(t)+C_4 \cdot Y(t) \quad (2)$$

$$R_{2x}=C_5 \cdot X(t)+C_6 \cdot Y(t) \quad (3)$$

$$R_{2y}=C_7 \cdot X(t)+C_8 \cdot Y(t) \quad (4)$$

The effect of the factors $C_1$-$C_8$ can be better understood if the above equations are reformulated as follows:

$$R_{1x}=B \cdot K_{1x} \cdot [X(t) \cdot \cos(\beta+\phi_{1x})-Y(t) \cdot \sin(\beta+\phi_{1x})] \quad (5)$$

$$R_{1y}=B \cdot K_{1y} \cdot [X(t) \cdot \sin(\beta+\phi_{1y})-Y(t) \cdot \cos(\beta+\phi_{1y})] \quad (6)$$

$$R_{2x}=B \cdot A \cdot K_{2x} \cdot [X(t) \cdot \cos(\beta+\alpha+\phi_{2x})-Y(t) \cdot \sin(\beta+\alpha+\phi_{2x})] \quad (7)$$

$$R_{2y}=B \cdot A \cdot K_{2y} \cdot [X(t) \cdot \sin(\beta+\alpha+\phi_{2y})-Y(t) \cdot \cos(\beta+\alpha+\phi_{2y})] \quad (8)$$

The constants $K_{ij}$ and $\phi_{ij}$ are calibration factors describing the effective deviation of a raster element (for example of a pair of coils or of a pair of electrodes) from the ideal geometry. It would ideally be the case that $K_{ij}=1$ and $\phi_{ij}=0$. For the deflection fields $R_{1X}$, $R_{1Y}$, $R_{2X}$ and $R_{2Y}$, the following equations then arise with the above simplification:

$$R_{1x}=B \cdot [X(t) \cdot \cos(\beta)-Y(t) \cdot \sin(\beta)] \quad (9)$$

$$R_{1y}=B \cdot [X(t) \cdot \sin(\beta)-Y(t) \cdot \cos(\beta)] \quad (10)$$

$$R_{2x}=B \cdot A \cdot [X(t) \cdot \cos(\beta+\alpha)-Y(t) \cdot \sin(\beta+\alpha)] \quad (11)$$

$$R_{2y}=B \cdot A \cdot [X(t) \cdot \sin(\beta+\alpha)-Y(t) \cdot \cos(\beta+\alpha)] \quad (12)$$

The size of the field scanned in the object plane can be changed with the variable B and the orientation of the image field in the object plane can be changed with the variable $\beta$. An adjustment in terms of intensity and orientation between the sample-side and the source-side deflection system can take place with the variables A and $\alpha$. In this case, $\alpha$ describes the angular orientations of the first and of the second deflection field in the sample-side deflection system (12) and in the source-side deflection system (9) with respect to one another. In the event of changeover between the different operating modes, the angle $\alpha$ describing the angular orientation between the deflection fields is changed by the formation of the linear combinations in the mixers (44). In some embodiments of the disclosure, the variable A can also be changed, that is to say the relative intensity of the deflection fields between the sample-side and the source-side deflection system.

It should not fail to be mentioned that, in the event of a change of A or $\alpha$, the size and/or the orientation of the image field scanned in the object plane simultaneously changes as well. If, in the event of a change in the variable A or the angular orientation $\alpha$, the size and the orientation of the image field is intended to be kept constant, it is simultaneously desirable to adapt the factor B and the angle $\beta$.

In order to generate and condition the different signals for the deflection elements in accordance with equations 9-12, the signal conditioning (47) in FIG. 4 is influenced not only by the parameter "adjustment mode" but also by the parameters "image field orientation" and "image field size". In this case, the control parameter "image field size" affects the factor B, the control parameter "image field orientation" affects the angle $\beta$, and the adjustment mode affects the factor A and the angular orientation $\alpha$, but indirectly also affects the variables B and $\beta$, if the image field is intended to remain constant.

The output stages (46) can generally be changed over between a plurality of voltage ranges in the case of deflection electrodes or current ranges in the case of deflection coils. The output stages thus contribute to an attenuation of the signal. This is desirable to be able to cover the large dynamic range used with regard to the image field size without a loss of quality.

In accordance with the relationships determined by equations 9-12, the signal conditioning controller (47) configures the analog mixers (44), the attenuators (45) and the output stages (46). In this case, the control variable "image field size" with the factor B substantially affects the attenuators (45) and the output stages (46), while the angle values $\alpha$ and $\beta$ exclusively affect the mixers (44). The factor A can be integrated into the signal conditioning in the mixers (44) and also in the attenuators (45) and the output stages (46).

In the alternative embodiment in accordance with FIG. 5, the functions X(t) and Y(t) already mixed digitally in the signal conditioning and generation controller (57) are generated directly in the signal generators (58). In this case, a dedicated signal generator (58) is present for each deflection element $R_{1X}$, $R_{1Y}$, $R_{2X}$, $R_{2Y}$. In the case of this arrangement, analogously to the embodiment of FIG. 4, the control variable B affects the attenuators (55) and the output stages (56) in order to be able to cover the large dynamic range of the image field size without a loss of quality.

The digital embodiment in accordance with FIG. 5 has the disadvantage by comparison with the analog signal conditioning in accordance with FIG. 4 that four instead of two signal generators are involved. In return, the embodiment in FIG. 5 affords the advantage that the inaccuracies that unavoidably occur during analog mixing are avoided.

It should also be pointed out that the devices for electrically displacing the image field in the object plane which are additionally used as well are not illustrated in FIGS. 4 and 5.

Figure 6:
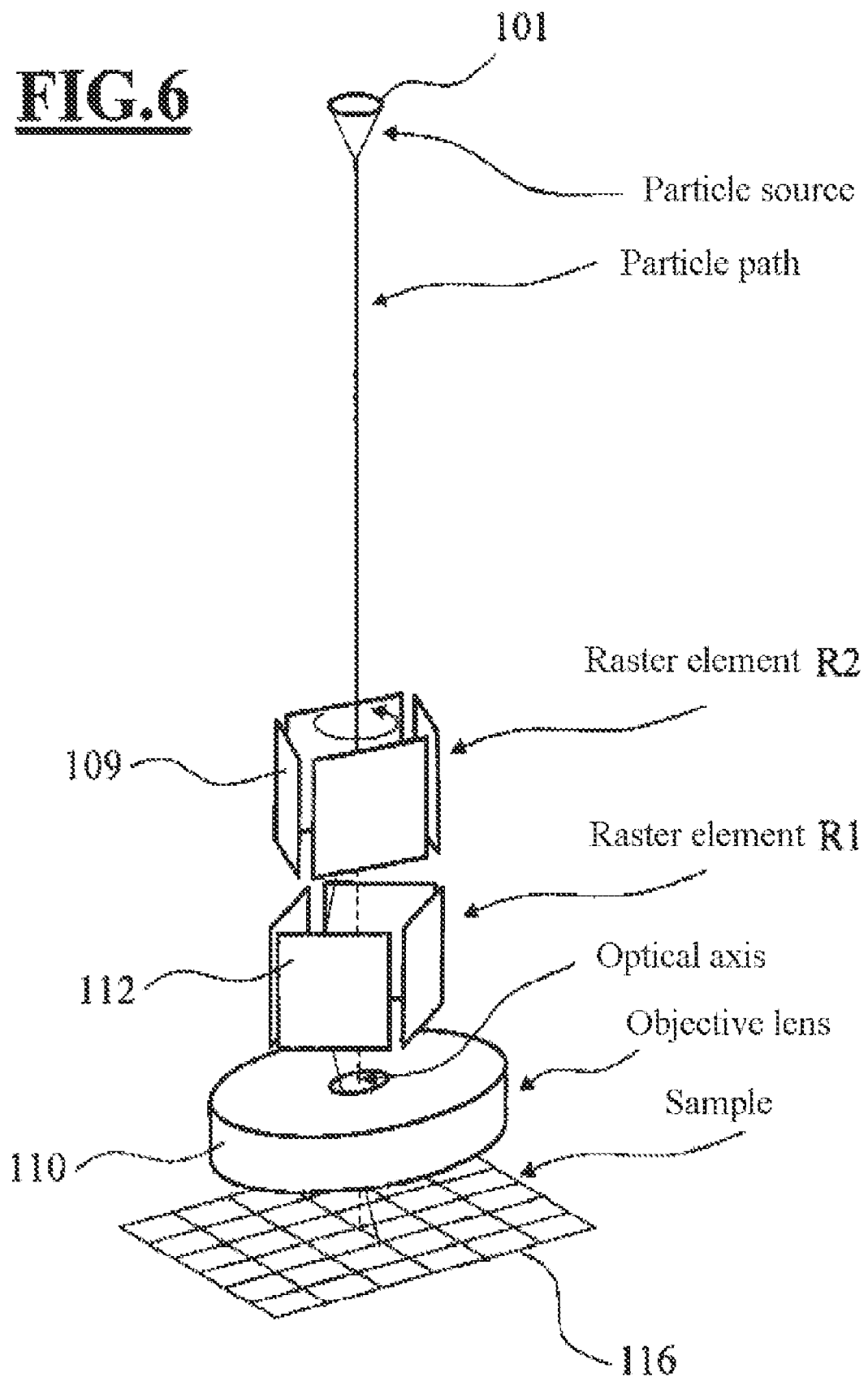
FIG. 6 shows a simplified perspective illustration of a particle beam device with two crossed deflection systems rotated relative to one another about the optical axis of the objective lens.

As a result of the formation of the linear combinations of the signals generated by the signal generators (41) and (42) in FIG. 4 in the mixers (44) and, respectively, in the arrangement according to FIG. 5, by the signal conditioning and generation controller (57), in the deflection systems deflection fields are generated which correspond to those of two deflection systems (109), (112) which are connected in series one after the other and which are rotated about the optical axis with respect to one another, as is illustrated in FIG. 6. The possibility for forming different linear combinations would correspond to an arrangement in which both deflection systems (109), (112) are freely rotatable about the optical axis, while the objective (110) remains stationary. The particle beam generator is designated by (101) in FIG. 6.

Depending on the application, it is expedient to choose somewhat different values for the factor A and the angular orientation α:

In the generation of overview images with slight magnification, the distortion of the image is dominant. Pincushion or barrel distortion is distinguished from an S-shaped distortion. In the case of a purely electrostatic objective lens, only the pincushion or barrel distortion occurs. The latter can be eliminated solely by a suitable choice of the variable A. In the case of particle beam devices including a magnetic objective lens, the Lamor rotation of the objective lens leads to a rotation and thus additionally to the S-shaped distortion. The S-shaped distortion can be compensated for by a suitable choice of the adjustment constant α. In general, for this purpose it is desirable to set A and α such that the particle beam passes through the objective lens in skew fashion, that is to say that there is no tilting point of the particle beam on the optical axis, but rather only a point of a greatest proximity of the particle beam to the optical axis.

If, by contrast, there is a desire to record images with a largest possible number of pixels or to write structures with a large number of pixels, then it should be taken into consideration that the number of pixels which an objective lens can transmit without giving rise to an additional blur at the image edge which is larger than one pixel is likewise limited by image aberrations. The significant image aberrations here include the off-axis coma aberration, which becomes visible as a tail, and the off-axis dispersion, which becomes visible as a line. Images having a pixel resolution of 10 000×10 000 pixels are possible when the illumination aperture is chosen to be sufficiently small. However, applications are also known in which image recordings with 30 000 pixels×30 000 pixels are desirable. One example thereof is the cartography of the brain with thousands of thin prepared slices which are intended each per se to be documented with thousands of images having a high number of pixels.

In the case of a purely electrostatic lens, only the isotropic components of the off-axis coma aberration and of the off-axis dispersion occur. These aberrations can be minimized by a suitable choice of the factor A. With the use of a magnetic objective lens or the combination of a magnetic objective lens and an electrostatic lens, however, anisotropic components of the off-axis coma aberration and of the off-axis dispersion also occur. These aberrations are oriented perpendicularly to the deflection direction. Therefore, these aberrations cannot be minimized by a suitable choice of the factor A. However, it is also possible to correct or minimize the anisotropic component of the off-axis coma aberration and the anisotropic component of the off-axis dispersion by a suitable choice of the angular orientation of the deflection fields. Given a suitable choice of the value a for the angular orientation depending on the objective used, it is therefore possible to record images having a pixel resolution of 100 000×100 000 pixels having the same sharpness over the entire recorded image field. Correspondingly, in lithography applications it is also possible to write structures having a correspondingly high number of pixels.

In conventional particle optics not corrected with regard to specific aberrations, the axial aberrations (axial chromatic aberration, spherical aperture aberration) are so large that only small illumination apertures can be used. Since the off-axis coma aberration is dependent quadratically on the illumination aperture, its effect with the use of conventional particle optics is relatively small and it is therefore possible to record image fields with 10 000×10 000 pixels. However, if the axial aberrations are corrected by correctors and the spatial resolution is thereby intended to be improved further, it is desirable to increase the illumination aperture by a factor of 3-10. It is only with such larger illumination apertures that the diffraction aberration becomes sufficiently small. Since, with these larger illumination apertures, however, the off-axis coma aberration also becomes larger by a factor of 10 to 100, the off-axis coma aberration gains in importance in this case. A recording of image fields with more than approximately 1000×1000 pixels is then not very practical. Both the isotropic and the anisotropic component of the off-axis coma aberration can be compensated for by the suitable choice of the factor A and of the angular orientation α of the deflection fields. As a result, even with illumination apertures that are larger by a factor of 3-10, image fields with 10 000×10 000 pixels can then be scanned and corresponding images can be generated practically.

Figure 9A:
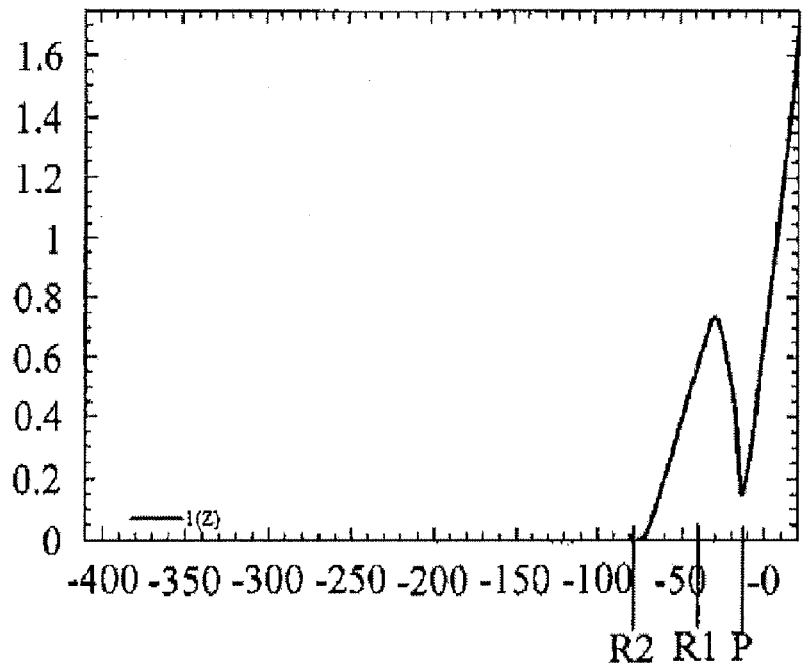
FIGS. 9a and 9b show diagrams of the radial distance of the trajectories of the particle beam in the case of two and three deflection systems, respectively.

In some applications, which in part have already been discussed further above, it is expedient to keep the sample in a "poor" vacuum during scanning with the particle beam, in order to prevent the sample from being charged, for example. In order to maintain the quality of the primary particle beam despite the relatively high pressure in the sample chamber, it is desirable for the particle beam to run in a good vacuum until just before the sample, in order that collisions between the particles in the particle beam and the molecules of the residual gas occur only over a shortest possible distance. For this purpose, it is customary to use a pressure stage aperture having a small opening closely upstream of the sample and to pump it differentially through the objective. The smaller the opening in the pressure stage aperture, the better the vacuum can be maintained for the primary particle beam in the beam guiding tube. However, the small opening in the pressure stage aperture generally leads to a restriction of the image field that can be scanned in the object plane. This can be avoided in the case of purely electrostatic objectives by using a double deflection system, in principle, by producing a virtual tilting point for the particle beam in the plane of the pressure stage aperture via corresponding driving of the double deflection system. In the case of particle beam devices including magnetic objective lenses or partial magnetic objective lenses, however, the Lamor rotation of the magnetic field emerging from the objective lens leads to an additional rotation of the trajectory. This has the consequence that the particle beam deflected by the source-side deflection system and directed back by the sample-side deflection system does not intersect the optical axis, but rather runs past the optical axis in skew fashion. This effect is illustrated in FIG. 9a, which illustrates the result of a simulation of the radial distance of the trajectories of a particle beam through a system including two deflection systems (R1) and (R2) arranged serially one behind the other and a magnetic lens. In this case, the lower end of the pole shoe defines the zero point of the horizontal axis in the figure and the two deflection systems are arranged at the positions designated by (R1) and (R2). As can be discerned, the particle beam initially running along the optical axis (X-axis) is firstly directed away from the optical axis by the source-side deflection system (R2) and subsequently directed back to the optical axis by the object-side deflection system (R1). However, the trajectory does not intersect the optical axis, but rather attains a minimum distance at a point (P), and the radial distance of the particle path from the optical axis subsequently increases again. In the case of this arrangement, a trimming of the image field that can be scanned in the object plane inevitably results.

Since, in the case of particle beam devices including magnetic objective lenses or partially magnetic objective lenses, the Lamor rotation of the magnetic field emerging from the objective lens can give rise to an additional rotation of the trajectory, upon changeover to the "tilting raster mode", which is realized only by attenuating a deflection system (i.e. only by changing the variable A), the particle probe will not remain on the sample, with the consequence that, during the analysis of crystal properties, for example, the results from different sample locations will be mixed. In order to avoid this, the angle adjustment a should be used here as well.

Figure 7:
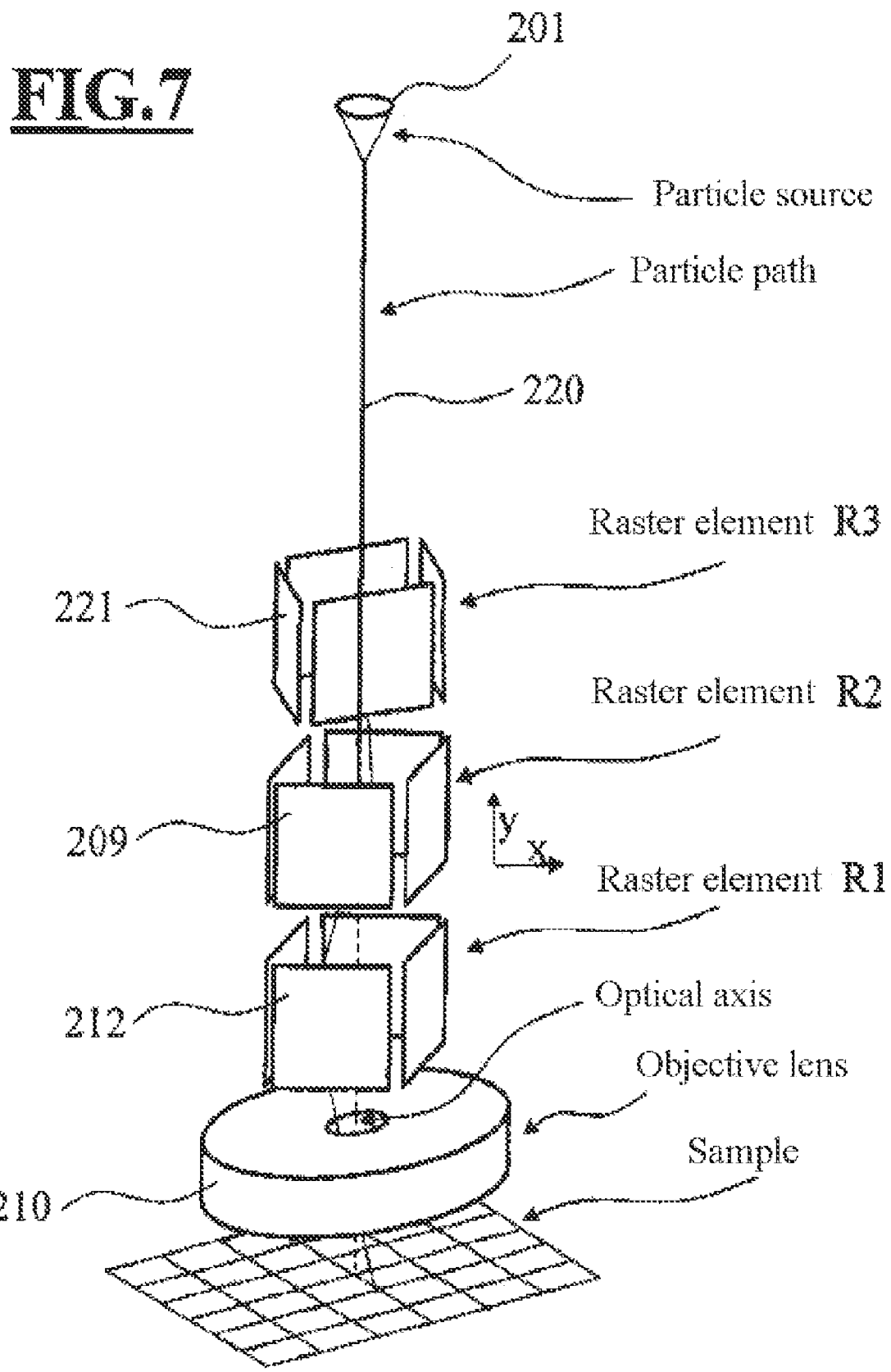
FIG. 7 shows a simplified perspective illustration of a particle beam device with three beam deflection systems arranged serially one behind another, of which one deflection system is rotated about the optical axis relative to the other two beam deflection systems.
Figure 9B:
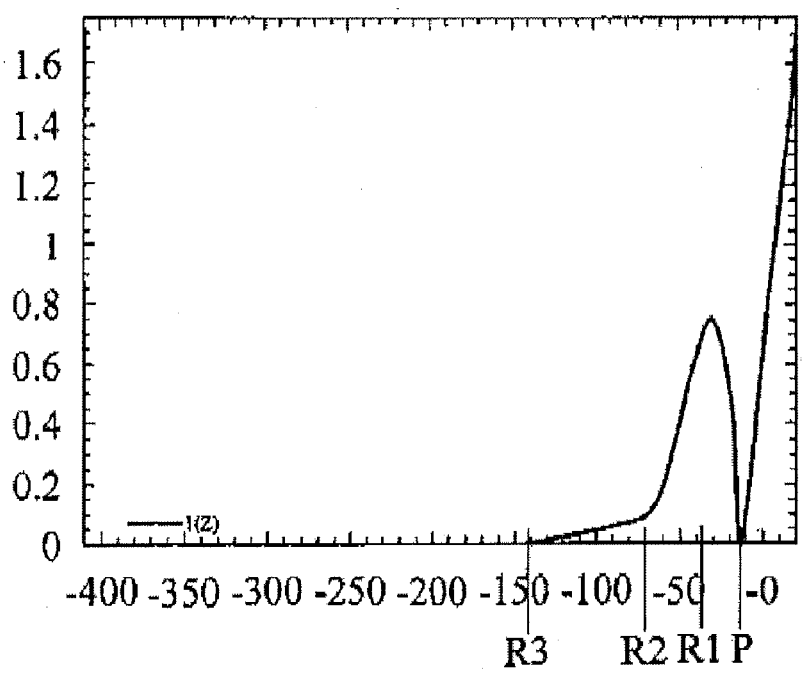

This problem can be eliminated by an arrangement as illustrated in FIG. 7. In FIG. 7, the particle source is designated by (201) and the objective lens by (210). Along the optical axis, three crossed deflection systems (209), (212) and (221) are now arranged serially one behind another, wherein one of the three deflection systems, in this case the deflection system (221) nearest the source side, is arranged in a manner rotated about the optical axis (220) relative to the other two deflection systems (209), (212). Since the deflection system (221) is rotated about the optical axis (220) relative to the deflection systems (209) and (212), the additional deflection system (221) generates a deflection field having a changed angular orientation relative to the deflection fields generated by the other two deflection systems (209) and (212). This additional degree of freedom of the angular orientation or of the changed angular orientation now makes it possible to guide the particle beam such that the particle beam intersects the optical axis, as is illustrated in FIG. 9b. At the location (P) at which the radial distance of the particle path from the optical axis vanishes, it is now possible to arrange a pressure stage aperture having an opening as small as desired, which leads to no trimming of the image field that can be scanned with the particle beam in the object plane.

Figure 8:
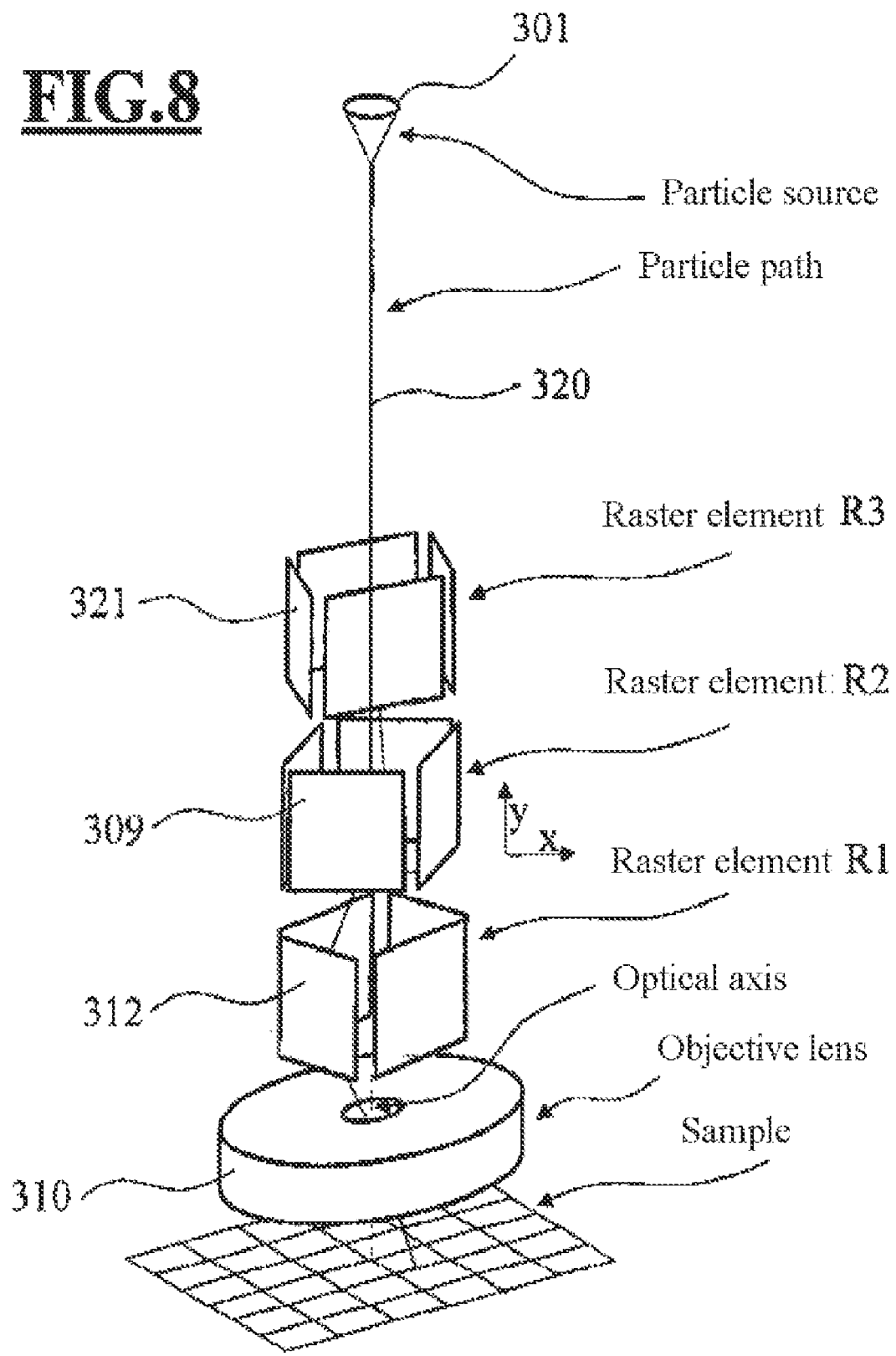
FIG. 8 shows a simplified perspective illustration of an embodiment with three deflection systems arranged serially one behind another, which are all rotated about the optical axis relative to one another.

FIG. 8 illustrates an alternative embodiment to the embodiment in FIG. 7. Like the embodiment in FIG. 7, the embodiment in FIG. 8 has three respectively crossed deflection systems (309), (312), (321) disposed serially one behind another along the optical axis (320) defined by the objective (310). However, in this exemplary embodiment, all three deflection systems (309), (312), (321) are arranged in a manner rotated about the optical axis relative to one another, wherein the relative angle of rotation between two successive deflection systems is at least 5 degrees, preferably more than 10 degrees and in turn preferably more than 20 degrees.

As already described further above, the same effect achieved by deflection systems rotated relative to one another can also be produced if only two respectively crossed deflection systems are disposed serially one behind the other and the driving of the deflection systems allows deflection fields with different angular orientations to be generated. In this case, the embodiments with electrically adjustable angular orientations by the formation of virtually any desired linear combination of the deflection fields also afford the advantage that the angular orientation between the deflection fields is adjustable as desired. Via the corresponding continuously variable setting of the factor A, in FIG. 9b the point of intersection of the particle beam with the optical axis can be set such that the image field that can be scanned with the particle beam becomes maximal. It is therefore possible in part to compensate for tolerances in the positioning of the pressure stage aperture.

By altering both the factor A and the angular orientation α during the operation of the particle beam device, it is possible to adapt the adjustment also in a manner dependent on the magnification set. In the case of low magnification, it is expedient to set the factor A and the angular orientation factor α such that an image field that is as large as possible can be scanned with little distortion in the object plane. In the case of a higher magnification set, if, on account of the correspondingly smaller image field scanned with the particle beam, the pressure stage aperture no longer limits the image field, the factor A and the angular orientation α can be chosen such that the number of pixels that can be transmitted without disturbing aberrations becomes maximal. What is achieved as a result is that at least in the case of high magnifications, during "variable pressure" operation, too, the number of pixels available is similar in magnitude to that which can also be achieved during the operation of the particle beam device with high vacuum in the sample chamber.

The disclosure has been described above principally on the basis of exemplary embodiments which serve for generating an image of a sample. However, the disclosure can equally also be used in the case of particle beam devices serving for patterning a sample surface, since, during the patterning of sample surfaces, too, there are often different desired properties for the size of the image field to be patterned, the homogeneity of the feature sizes over the image field and the particle probe fineness achieved during patterning, which like the resolution in the image-generating particle beam device is determined by the size of the particle probe in the object plane.

With the aid of the present disclosure, the particle beam device can have different operating modes which can be selected by the user. In each of the operating modes that can be selected by the user, for the deflection of the particle beam in the deflection systems angular orientations between the deflection fields are in each case set or kept available which lead to a minimization of that imaging aberration which becomes apparent with the greatest adverse effect in the respective application. In some applications it is also possible, via a suitable changed choice of the angular orientation between the deflection fields and/or the amplitude relationships (factor A), to optimize to the sum of two or more imaging aberrations, such that the sum of the different disturbing aberrations becomes minimal.

In order to find suitable values for α and A, it is possible to observe the aberration effects that occur at an image point and to vary α and A until the disturbing aberration effects are sufficiently small or the image field restriction that occurs is reduced to the desired extent. The values thus found for α and A are then stored and correspondingly selected either manually or automatically later during image recording in accordance with the desired type of imaging or application.

In general, for each operating mode there is a respective pair of values for α and A which is applied to the entire image field in the operating mode if the objective lens is rotationally symmetrical.

In one embodiment of the disclosure, compensation of the distortion is kept available via nonlinear components in the signal generation (43) for the deflection elements.

That has the advantage that, in addition to the distortion, other imaging aberrations mentioned above can then be corrected or minimized by suitable values for α and A.

What is claimed is:

1. A particle beam device, comprising:
   a particle beam generator;
   an objective lens configured to focus a particle beam generated by the particle beam generator in an object plane, the objective lens defining an optical axis; and
   first and second deflection systems configured to deflect the particle beam in the object plane, the first and the second deflection systems being arranged in series along the optical axis,
   wherein:
      in a first operating mode, the first deflection system is configured to generate a first deflection field and the second deflection system is configured to generate a second deflection field, the first and the second deflection fields having a first angular orientation with respect to one another, the first and second deflection fields being aligned with respect to one another so that they jointly produce in the object plane a deflection of the particle beam in a first direction;
      in a second operating mode, the first deflection system is configured to generate a third deflection field and the second deflection system is configured to generate a fourth deflection field, the third and fourth deflection fields having a second angular orientation with respect to one another, the third and fourth deflection fields being aligned with respect to one another so that they jointly produce in the object plane a deflection of the particle beam in the first direction; and
      the second angular orientation is different from the first angular orientation.

2. The particle beam device of claim 1, wherein the third deflection field is different from the first deflection field, and/or the fourth deflection field is different from the second deflection field.

3. The particle beam device of claim 1, wherein, in the first operating mode, the first angular orientation is chosen so that the off-axis coma aberration is minimal during focusing of the particle beam by the objective lens.

4. The particle beam device of claim 1, wherein, in the first operating mode, the first angular orientation is chosen so that the common effect of both the off-axis coma aberration and of the off-axis dispersion is minimal during focusing of the particle beam by the objective lens.

5. The particle beam device of claim 1, wherein, in a second operating mode, the second angular orientation is chosen so that the distortion is minimal during focusing of the particle beam by the objective lens.

6. The particle beam device of claim 1, wherein, in a second operating mode, the second angular orientation is chosen so that the trimming of the image field by a bottleneck in the beam tube is minimal during focusing of the particle beam by the objective lens.

7. The particle beam device of claim 6, wherein the bottleneck is the opening of a pressure stage aperture.

8. The particle beam device of claim 1, wherein:
   in the first operating mode, the first deflection system is configured to generate a fifth deflection field and the second deflection system is configured to generate a sixth deflection field, the first and second deflection fields having the first angular orientation with respect to one another, the first and second deflection fields being aligned with respect to one another so that they jointly produce in the object plane a deflection of the particle beam in a second direction, which is neither parallel nor antiparallel to the first direction; and
   in the second operating mode, the first deflection system is configured to generate a seventh deflection field and the second deflection system is configured to generate an eighth deflection field, the seventh and the eighth deflection fields having the second angular orientation with respect to one another, and the seventh and eight deflection fields being aligned with respect to one another so that they jointly produce in the object plane a deflection of the particle beam in the second direction.

9. A particle beam device, comprising:
   a particle beam generator;
   an objective lens configured to focus a particle beam generated by the particle beam generator in an object plane, the objective lens defining an optical axis; and
   first, second and third deflection systems configured to deflect the particle beam in the object plane, the first, the second and the third deflection systems being are arranged in series along the optical axis,
   wherein the third deflection system is rotated about the optical axis by more than 5° relative to the first deflection system, and the third deflection system is rotated about the optical axis by more than 5° relative to the second deflection system.

10. The particle beam device of claim 9, wherein the second deflection system is rotated about the optical axis by at least 5° relative to the first deflection system.

11. The particle beam device of claim 10, wherein the second deflection system is rotated about the optical axis by at least 10° relative to the first deflection system.

12. The particle beam device of claim 9, wherein the third deflection system is rotated about the optical axis by more than 10° relative to the first deflection system, and the third deflection system is rotated about the optical axis by more than 10° relative to the second deflection system.

13. The particle beam device of claim 9, wherein the particle beam device has first and a second operating modes, and changing between the first and second operating modes is achieved by switching on, switching off or reversing the polarity of the third deflection system or passively connecting up one of the deflection systems.

14. The particle beam device of claim 13, wherein changing between the first and second operating modes is achieved in the case of a change in the maximum deflection produced by the deflection systems in the object plane.

15. The particle beam device of claim 13, wherein changing between the first and the second operating modes is achieved depends on a change in the illumination aperture.

16. The particle beam device of claim 13, wherein changing between the first and the second operating modes is achieved depends on the chosen number of pixels of an image to be recorded with the aid of the particle beam or structure to be written.

17. The particle beam device of claim 13, wherein changing between the first and the second operating modes is achieved depends on whether a bottleneck is present in the beam tube between the first, second and third deflection systems and the object plane.

18. The particle beam device of claim 9, wherein each of the first, second and third deflection systems is configured to generate deflection fields in two directions which are neither parallel nor antiparallel to one another.

19. A method for operating a particle beam device comprising a particle beam generator, an objective lens and first and second deflection systems, the objective lens being configured to focus a particle beam generated by the particle beam generator in an object plane, and the first and second systems configured to deflect the particle beam in an object plane defined by the objective lens, the first and second deflections system being in series along the optical axis, the method comprising:

operating the device in a first operating mode in which the first deflection system generates a first deflection field and the second deflection system generates a second deflection field, the first and the second deflections field having a first angular orientation with respect to one another, and the first and second deflection fields being aligned with respect to one another such that they jointly produce in the object plane a deflection of the particle beam in a first direction;

operating the device in a second operating mode in which the first deflection system generates a third deflection field and the second deflection system generates a fourth deflection field, the third and fourth deflection fields having a second angular orientation with respect to one another, and the third and fourth deflection fields being aligned with respect to one another such that they jointly produce in the object plane a deflection of the particle beam in the first direction, the second angular orientation being different from the first angular orientation; and switching between the first and second operating modes while operating the device.

20. The method of claim 19, wherein the particle beam device is an electron microscope.

* * * * *

UNITED STATES PATENT AND TRADEMARK OFFICE
CERTIFICATE OF CORRECTION

PATENT NO. : 8,405,045 B2
APPLICATION NO. : 13/306529
DATED : March 26, 2013
INVENTOR(S) : Dirk Preikszas et al.

It is certified that error appears in the above-identified patent and that said Letters Patent is hereby corrected as shown below:

In the Specifications

Column 2,
Line 31, after "minimal" insert --.--

Column 4,
Line 3, after "minimal" insert --.--

Column 4,
Line 34, after "minimal" insert --.--

Column 12,
Line 1, delete "a" and insert --α--

Column 13,
Line 24, delete "a" and insert --α--

Signed and Sealed this
Fourth Day of June, 2013

Teresa Stanek Rea
*Acting Director of the United States Patent and Trademark Office*